United States Patent
Lin et al.

(10) Patent No.: US 10,068,693 B2
(45) Date of Patent: Sep. 4, 2018

(54) MULTI-LAYER WIRING STRUCTURE, MAGNETIC ELEMENT AND MANUFACTURING METHOD THEREOF

(71) Applicant: CYNTEC CO., LTD., Hsinchu (TW)

(72) Inventors: Chun-Chih Lin, Hisnchu (TW); Yi-Wei Chen, Hsinchu (TW); Yi-Ting Lai, Hsinchu (TW); Chu-keng Lin, Hsinchu (TW); Cheng-Chang Lee, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 14/931,580

(22) Filed: Nov. 3, 2015

(65) Prior Publication Data
US 2017/0027061 A1    Jan. 26, 2017

(30) Foreign Application Priority Data

Jul. 22, 2015 (TW) .............................. 104123654 A

(51) Int. Cl.
*H01F 27/32* (2006.01)
*H01F 27/28* (2006.01)
(Continued)

(52) U.S. Cl.
CPC ......... *H01F 27/2804* (2013.01); *H01F 27/24* (2013.01); *H05K 1/165* (2013.01);
(Continued)

(58) Field of Classification Search
CPC .. H01F 41/02–41/0253; H01F 27/2804; H01F 27/24; H01F 2027/2809;
(Continued)

(56) References Cited

U.S. PATENT DOCUMENTS 3,107,566 A * 10/1963 Archer .................. B21D 28/06
                                                        156/261
4,644,643 A *  2/1987 Sudo ...................... H02K 29/08
                                                        156/273.9
(Continued)

FOREIGN PATENT DOCUMENTS

CN          201032609 Y     3/2008
CN          201392705 Y     1/2010
(Continued)

*Primary Examiner* — Peter DungBa Vo
*Assistant Examiner* — Kaying Kue
(74) *Attorney, Agent, or Firm* — Kirton McConkie; Evan R. Witt

(57) ABSTRACT

A multi-layer wiring structure includes a first conductive structure, a second conductive structure and an insulating layer. To manufacturing the multi-layer wiring structure, a first conductive structure and a second conductive structure are provided. The first conductive structure and the second conductive structure include a plurality of wiring patterns. Then, the insulating layer is disposed between the first conductive structure and the second conductive structure. The insulting layer is thinner than the first conductive structure or the second conductive structure. The first conductive structure, the insulating layer and the second conductive structure are laminated to form the multi-layer wiring structure. A planar magnetic element having a compact coil manufactured by the method is also provided.

17 Claims, 13 Drawing Sheets

(51) Int. Cl.
*H01F 27/24* (2006.01)
*H05K 1/16* (2006.01)
*H05K 1/09* (2006.01)
*H05K 1/02* (2006.01)
*H05K 3/20* (2006.01)

(52) U.S. Cl.
CPC .... *H01F 2027/2809* (2013.01); *H05K 1/0298* (2013.01); *H05K 1/09* (2013.01); *H05K 3/202* (2013.01); *H05K 2201/086* (2013.01)

(58) Field of Classification Search
CPC ........ H05K 1/165; H05K 1/09; H05K 1/0298; H05K 3/202; H05K 2201/086; Y10T 29/4902; Y10T 29/49073; Y10T 29/49075; Y10T 29/49078
USPC ........................................ 29/602.1, 830, 825
See application file for complete search history.

(56) References Cited

U.S. PATENT DOCUMENTS

| | | | | |
|---|---|---|---|---|
| 4,809,058 A | * | 2/1989 | Funamoto | H01L 23/473 257/697 |
| 5,387,551 A | * | 2/1995 | Mizoguchi | H01F 41/02 148/DIG. 12 |
| 5,972,780 A | * | 10/1999 | Machida | B29C 43/56 438/455 |
| 6,167,610 B1 | * | 1/2001 | Nakahara | H02K 1/14 29/596 |
| 6,615,481 B1 | * | 9/2003 | LaPlante | H01F 17/0013 29/602.1 |
| 6,768,409 B2 | * | 7/2004 | Inoue | H01F 17/0013 29/602.1 |
| 6,906,396 B2 | * | 6/2005 | Tuttle | H01L 23/3107 257/433 |
| 6,952,153 B2 | * | 10/2005 | Jacobson | H01F 17/0033 336/200 |
| 7,169,313 B2 | * | 1/2007 | Card | H05K 3/108 216/13 |
| 8,203,418 B2 | * | 6/2012 | Harrison | H01F 19/04 336/192 |
| 9,721,725 B2 | * | 8/2017 | Kido | H01F 41/042 |
| 2001/0029119 A1 | * | 10/2001 | Chung | H01Q 1/36 439/91 |
| 2003/0011458 A1 | * | 1/2003 | Nuytkens | H01F 27/24 336/200 |
| 2008/0186124 A1 | | 8/2008 | Schaffer et al. | |
| 2009/0288280 A1 | * | 11/2009 | Brendel | H01G 4/228 29/25.41 |
| 2010/0078213 A1 | * | 4/2010 | Furutani | H01L 21/486 174/266 |
| 2012/0219777 A1 | | 8/2012 | Schumacher et al. | |
| 2013/0213693 A1 | * | 8/2013 | Ho | H01L 21/4857 174/251 |
| 2014/0002228 A1 | * | 1/2014 | Hatanaka | H01F 38/14 336/200 |
| 2014/0231007 A1 | | 8/2014 | Schumacher et al. | |
| 2015/0061805 A1 | * | 3/2015 | Eom | H01F 27/2804 336/65 |

FOREIGN PATENT DOCUMENTS

| | | |
|---|---|---|
| CN | 103429423 A | 12/2013 |
| CN | 1029175546 B | 7/2015 |
| TW | 200841572 A | 10/2008 |
| TW | 201336360 A | 9/2013 |
| TW | 201444429 A | 11/2014 |

* cited by examiner

MULTI-LAYER WIRING STRUCTURE, MAGNETIC ELEMENT AND MANUFACTURING METHOD THEREOF

FIELD OF THE INVENTION

The present disclosure relates to a multi-layer wiring structure, a magnetic element having the multi-layer wiring structure and a manufacturing method, and particularly to a multi-layer wiring structure, a magnetic element and a manufacturing method used in a PCB type planar electronic device.

BACKGROUND OF THE INVENTION

Copper clad laminates (CCL) are key materials of printed circuit boards (PCB) and are widely used in many technical fields. The copper clad laminates include glass fabric for reinforcement, epoxy resin, and copper foil. Please refer to FIG. 1A illustrating a simplest structure of the copper clad laminate. The substrate 10 interposed between the copper foil 11 and 12 is made of the glass fabric and the epoxy resin. The pieces of the cooper foil 11 and 12 for wires are evenly bound to opposite surfaces of the substrate 10. To enhance strength of the sandwich structure of the copper clad laminate, thickness of the substrate 10 should be greater than 0.1 mm. However, to thicken the substrate 10 is inconsistent with the trend toward smaller size in electronic industry. Moreover, to form wires, the copper foil 11 and 12 formed on the opposite surfaces of the substrate 10 should be patterned through procedures of photoresist application, exposure, developing, etching and photoresist removal. A great deal of chemical solution is used in these procedures, especially exposure and developing. The chemical solution is harmful to the environment. Furthermore, material loading, unloading and arrangement for forming the copper clad laminate require manual operation. Therefore, it is difficult to lower production cost and shorten production period, and human error is probably inevitable.

FIG. 1B is a cross-sectional view illustrates a printed circuit board having a multi-layer wiring structure. The copper wires 19 are formed by wet-etching, and side effect such as undercutting occurs at edges of the copper wires 19. For example, the copper wires 19 have round or sloping sidewalls. The distance of the undercutting is called bias d1. For high power applications, thicker copper wires are adopted to endure high currents. However, thicker copper wires result in worse undercutting and greater bias d1. For example, if the thickness d4 of the copper wires 19 is about 0.15 mm, the bias d1 is greater than 0.15 mm. Please focus on two adjacent copper wires 191 and 192 in FIG. 1B, the narrowest portion and the widest portion thereof are located at a top surface and a bottom surface, respectively. The top spacing d2 is a distance between the top edges (the narrowest portion of the wires in this example) of the two adjacent copper wires 191 and 192, while the bottom spacing d3 is a distance between the bottom edges (the widest portion of the wires in this example) of the two adjacent copper wires 191 and 192, that is, the top spacing d2 is greater than the bottom spacing d3 in this example. For a wire with an irregular cross-section, insulating properties are determined based on a smaller one of the top spacing d2 and the bottom spacing d3. Considering the undercutting phenomenon, the spacing defined in the pattern mask should be increased to maintain required insulating properties. Therefore, the size of the printed circuit board is enlarged while a certain area is wasted.

Accordingly, a multi-layer wiring structure and a related manufacturing method which can overcome the undercutting problems are desired. Furthermore, the multi-layer wiring structure and the manufacturing method can precisely position/align the metal wires and control dimension of the metal wires.

SUMMARY OF THE INVENTION

The present disclosure provides a manufacturing method of a multi-layer wiring structure. A first conductive structure and a second conductive structure including a plurality of wiring patterns are provided. An insulating layer is disposed between the first conductive structure and the second conductive structure wherein the insulating layer is thinner than the first conductive structure or the second conductive structure. At last, the first conductive structure, the insulating layer and the second conductive structure are laminated to form the multi-layer wiring structure.

Another aspect of the present disclosure provides a multi-layer wiring structure. The multi-layer wiring structure includes a first conductive structure, a second conductive structure and an insulating layer which is disposed between the first conductive structure and the second conductive structure. The first conductive structure and the second conductive structure include a plurality of wiring patterns. The insulating layer is thinner than the first conductive structure or the second conductive structure.

Another aspect of the present disclosure provides a planar magnetic element. The planar magnetic element includes a magnetic core and a winding unit. The winding unit includes a first wiring pattern, a second winding pattern and an insulating layer which is disposed between the first wiring pattern and the second wiring pattern. The insulating layer is thinner than the first wiring pattern or the second wiring pattern.

BRIEF DESCRIPTION OF THE DRAWINGS

The advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
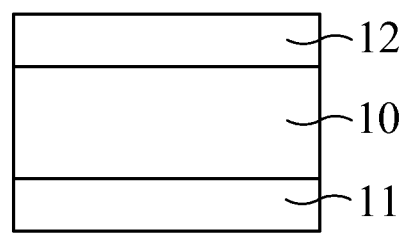
FIG. 1A is a cross-sectional view illustrating structure of a conventional copper clad laminate.
Figure 1B:
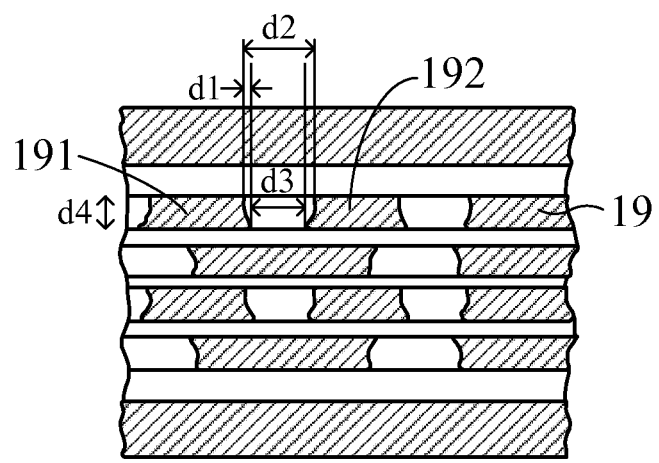
FIG. 1B is a is a cross-sectional view illustrating a printed circuit board (PCB) having a multi-layer wiring structure formed by a conventional manufacturing method.
Figure 2A:
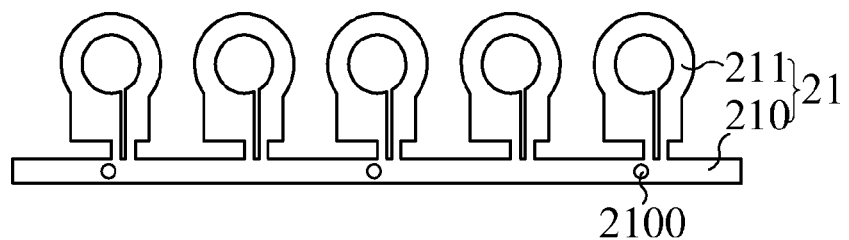
FIGS. 2A~2E are schematic diagrams illustrating a manufacturing method of a PCB type multi-layer wiring structure according to an embodiment of the present invention.
Figure 2B:
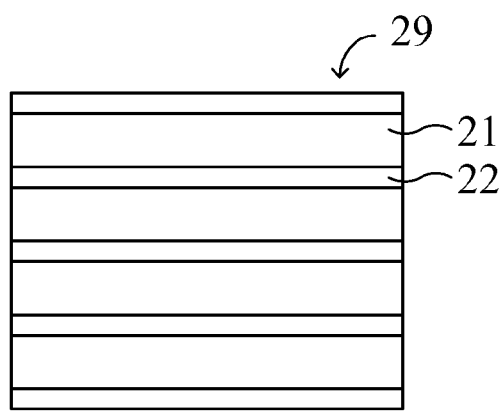
Figure 2C:
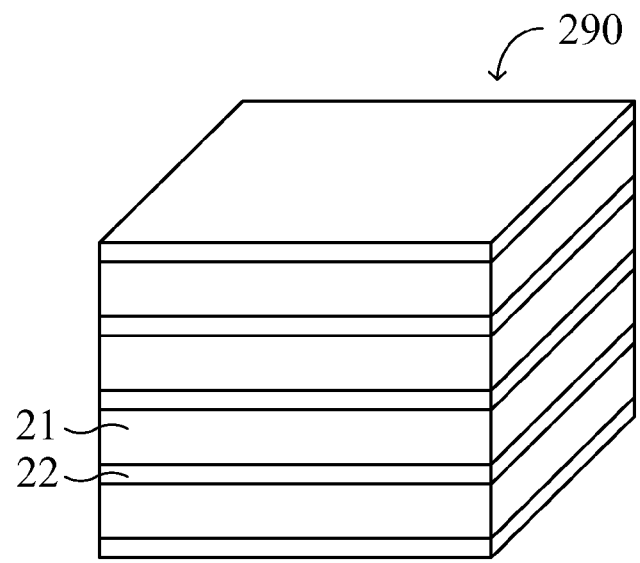

Please refer to FIGS. 2A~2C, schematic diagrams illustrating principles of a manufacturing method for forming a PCB type multi-layer wiring structure according to the present disclosure. In this manufacturing method, at least one conductive structure 21 is formed by a stamping (pressing) process or an etching process. Each conductive structure 21 includes a plurality of wiring patterns 211 and a connection strip 210 (FIG. 2A). All of the wiring patterns 211 in one conductive structure 21 are connected to the connection strip 210, and the wiring patterns 211 may have the same or slightly different shapes. At least one positioning hole 2100 is formed on the connection strip 210, if necessary. The wiring patterns 211 and the connection strip 210 are made of a metal material (e.g. copper) or an alloy material and integrally formed by the stamping process or the etching process. Brown oxide treatment may be further applied to the conductive structure 21 to roughen the surface of the wiring patterns 211.

Figure 2D:
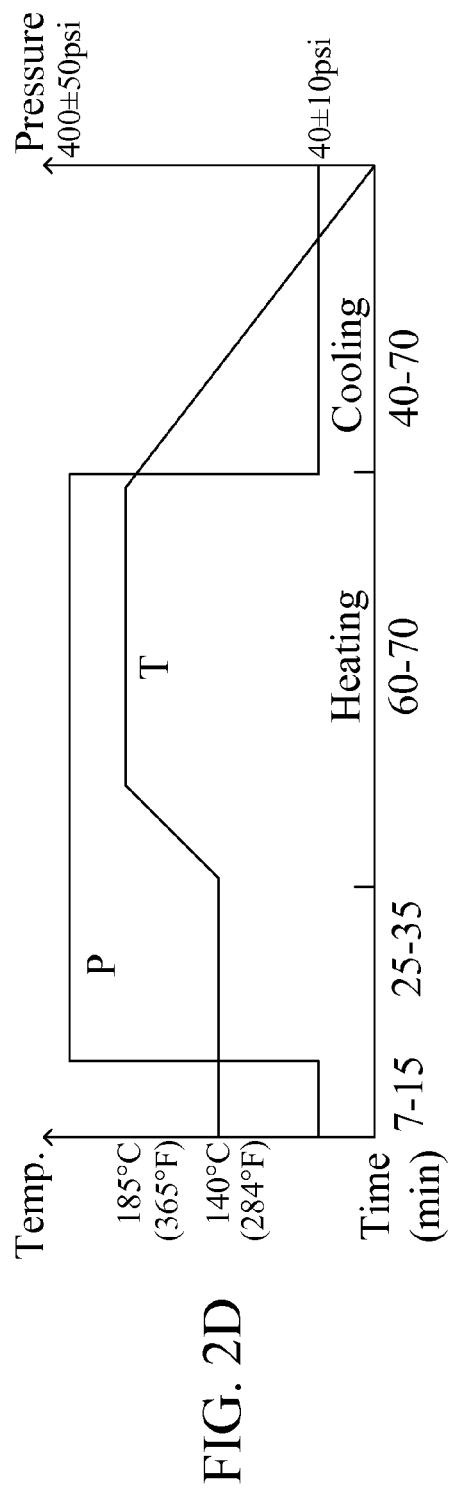
Figure 2E:
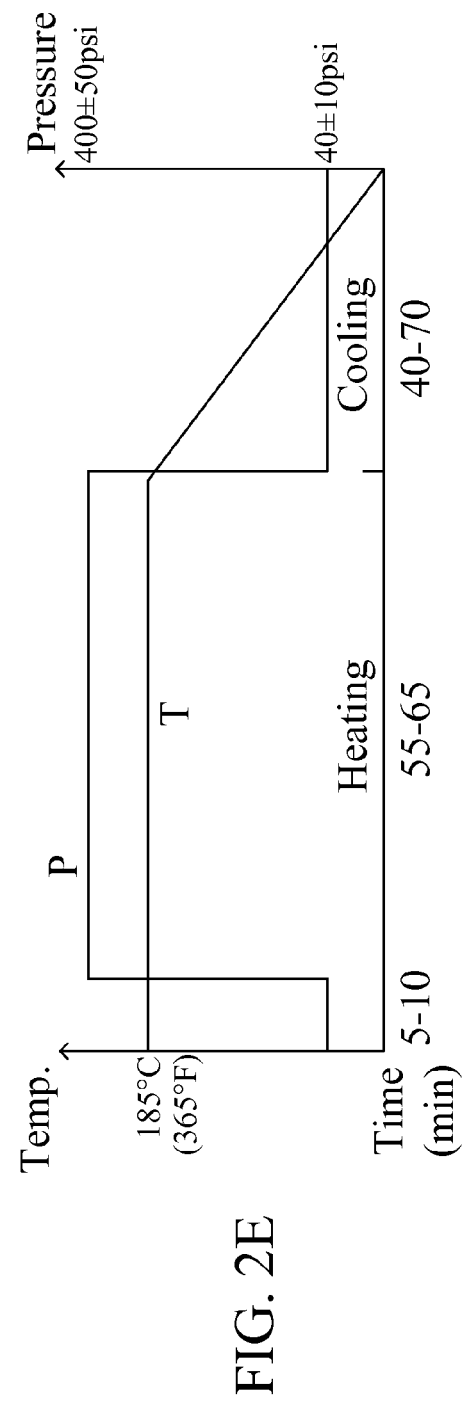

Please refer to the multi-layer wiring structure 29 in FIG. 2B. The PCB type multi-layer wiring structure 29 includes a plurality of conductive structures 21 and insulating layers 22 arranged in an alternate manner. The stack of the conductive structures 21 and the insulating layers 22 are laminated to form the multi-layer wiring structure 29. The conductive structures 21 are positioned and aligned by inserting positioning pins in the positioning holes 2100. Thus, only slight horizontal shift or even no shift of the conductive structures 21 occurs during lamination. The positioning pins together with the connection strips 210 are removed after the lamination step. Since the wiring patterns 211 are formed before the lamination, the insulating layers 22 do not have to undergo the conventional metal pattern process including procedures of photoresist application, exposure, developing, etching and photoresist removal. Therefore, the strength requirement of the insulating layers 22 is not as strict as the conventional manufacturing method. The insulating layers 22 may be thinner than the conductive structures 21, e.g. 0.015 mm~0.2 mm. Hence, the overall thickness of the multi-layer wiring structure 29 can be significantly reduced. For example, the insulating layers 22 are made of prepreg mainly including glass fiber and resin. The prepreg is soft and can properly fit the conductive structures 21 after curing during the lamination step. In an embodiment, the conductive structures 21 and the insulating layers 22 are laminated by hot press lamination. The conductive structures 21 are solely preheated or heated with the insulting layers 22. The temperature for lamination may range from 180° C. to 230° C. FIG. 2D and FIG. 2E illustrate two examples of temperature and pressure curves for the hot press lamination. In particular, FIG. 2D illustrates a two-step heating process under two pressure stages, while FIG. 2E illustrates a one-step heating process under two pressure stages.

Then, a cutting procedure such as routing or contour cutting is performed on the laminated multi-layer wiring structure 29 to remove the connection strips 210 from the wiring patterns 211 and divide the multi-layer wiring structure 29 into a plurality of multi-layer wiring units 290 (FIG. 2C) which include desired number of wiring patterns 211. For example, the multi-layer wiring units 290 are used in compact coils or other electronic units. It is to be noted that the thickness of the insulating layers 22 in the multi-layer wiring units 290 is significantly reduced so that the electronic units using the multi-layer wiring units 290 have greatly improved compact size.

Figure 3A:
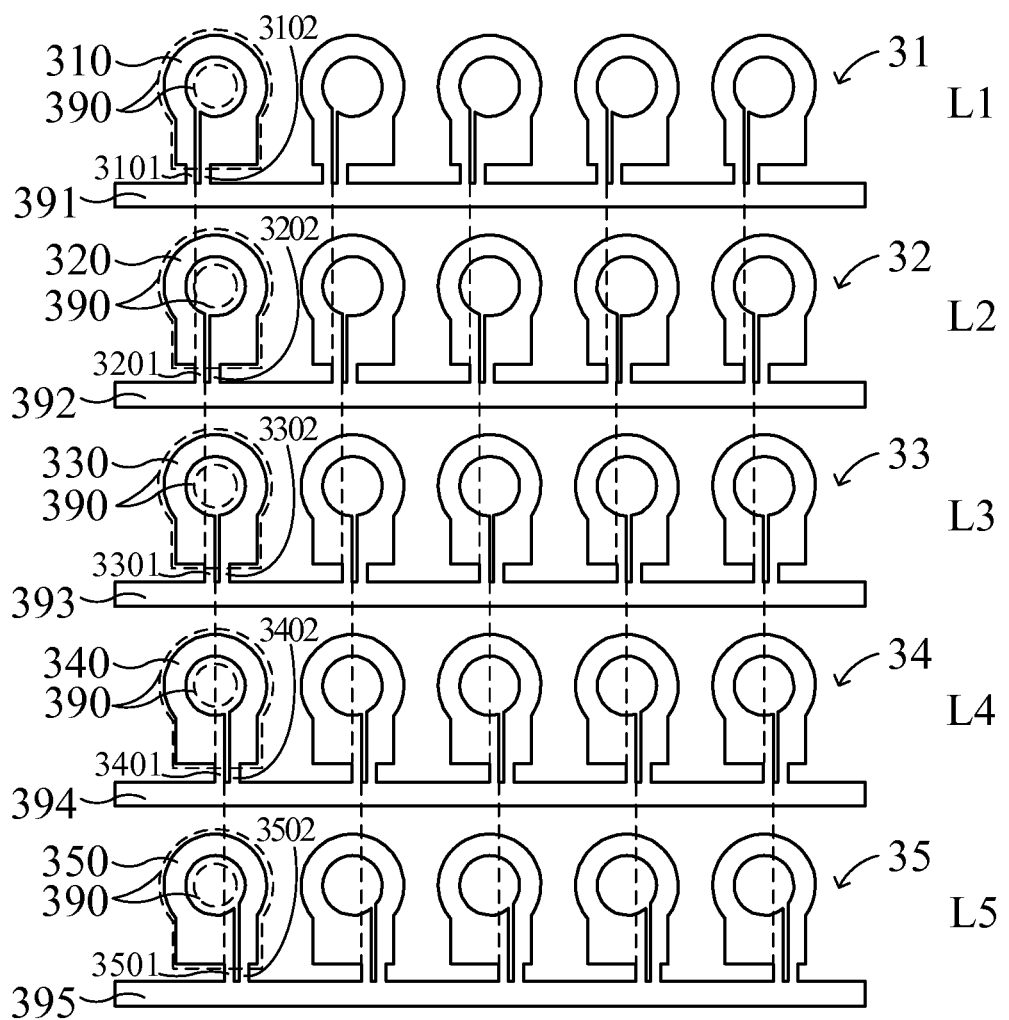
FIGS. 3A~3E are schematic diagrams illustrating parts of compact coil structures according to embodiments of the present invention.

Please refer to FIG. 3A illustrating layers of conductive structures which are used in a compact coil. In this embodiment, the compact coil has five layers L1~L5 of conductive structures 31~35, but the present invention does not limit the number of the layers. The wiring patterns 310, 320, 330, 340 and 350 have similar shapes. In the first conductive structure 31, each wiring pattern 310 is connected to the connection strip 391 through two leads 3101 and 3102. In the second conductive structure 32, each wiring pattern 320 is connected to the connection strip 392 through two leads 3201 and 3202. In the third conductive structure 33, each wiring pattern 330 is connected to the connection strip 393 through two leads 3301 and 3302. In the fourth conductive structure 34, each wiring pattern 340 is connected to the connection strip 394 through two leads 3401 and 3402. In the fifth conductive structure 35, each wiring pattern 350 is connected to the connection strip 395 through two leads 3501 and 3502. The relative positions of the leads 3101, 3102, 3201, 3202, 3301, 3302, 3401, 3402, 3501 and 3502 to the wiring patterns 310, 320, 330, 340 and 250 are different. After the conductive structures 31~35 and the insulating layers 22 are alternately stacked and laminated, outlines (or routing lines 390) of the wiring patterns 310, 320, 330, 340 and 350 are vertically aligned. The above-described positioning holes and positioning pins may be used in this step. Thus, the right lead 3102 of the wiring pattern 310 is aligned with the left lead 3201 of the wiring pattern 320; the right lead 3202 of the wiring pattern 320 is aligned with the left lead 3301 of the wiring pattern 330; the right lead 3302 of the wiring pattern 330 is aligned with the left lead 3401 of the wiring pattern 340; and the right lead 3402 of the wiring pattern 340 is aligned with the left lead 3501 of the wiring pattern 350.

Figure 3B:
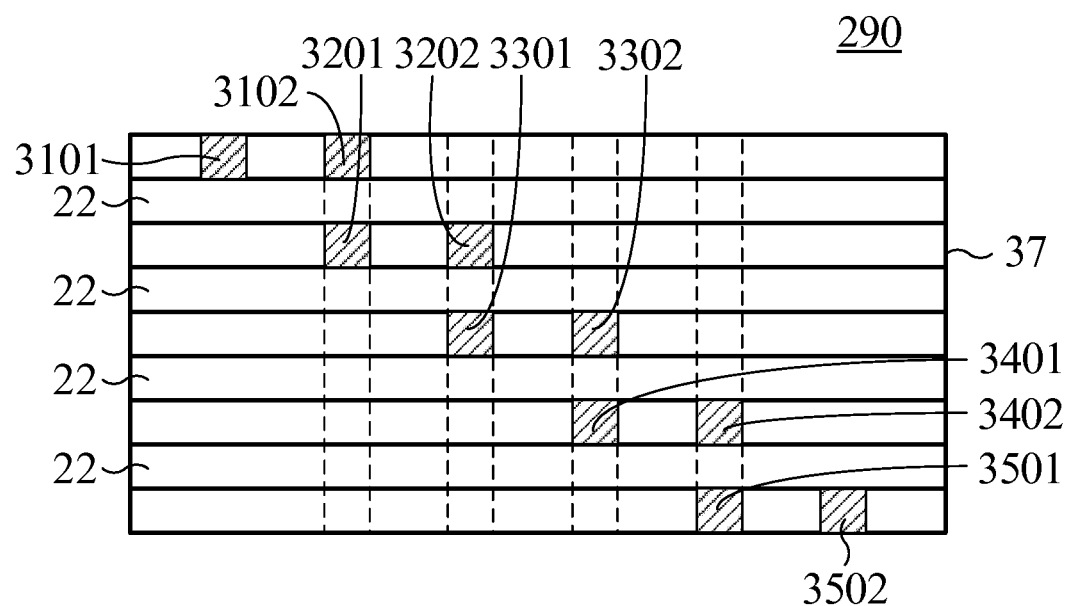

Then, a cutting procedure such as routing or contour cutting is performed along the cutting lines 390 to remove the connection strips 391~395 and divide the multi-layer wiring structure 29 into multi-layer wiring units 290. The leads 3101, 3102, 3201, 3202, 3301, 3302, 3401, 3402, 3501 and 3502 are revealed on the cutting surface (lateral surface) 37 of the multi-layer wiring unit 290, as shown in FIG. 3B. The alignment of the leads 3102, 3201, 3202, 3301, 3302, 3401, 3402 and 3501 can be observed by viewing the cutting surface 37 of the multi-layer wiring unit 290. A corresponding connecting member 39 is coupled to the cutting surface 37 of the multi-layer wiring unit 290 to electrically connecting the leads 3101, 3102, 3201, 3202, 3301, 3302, 3401, 3402, 3501 and 3502 of the wiring patterns 310, 320, 330, 340 and 350 in a desired manner so as to form, for example, a compact coil. It is to be noted that the present invention does not limit the electrical connection relation of the wiring patterns, and it should be decided according to the real applications. The connecting member 39 can electrically connect the wiring patterns 310~350 in series or parallel as desired. Furthermore, by testing the exposed leads 3101, 3102, 3201, 3202, 3301, 3302, 3401, 3402, 3501 and 3502 revealed on the cutting surface 37, the fault diagnosis of the multi-layer wiring unit 290 can be simplified. Other measurements such as interlayer distance, alignment shift of wiring pattern and undercutting bias of the PCB type multi-layer wiring structure 29/unit 290 may be made on the cutting surface 37.

Figure 3C:
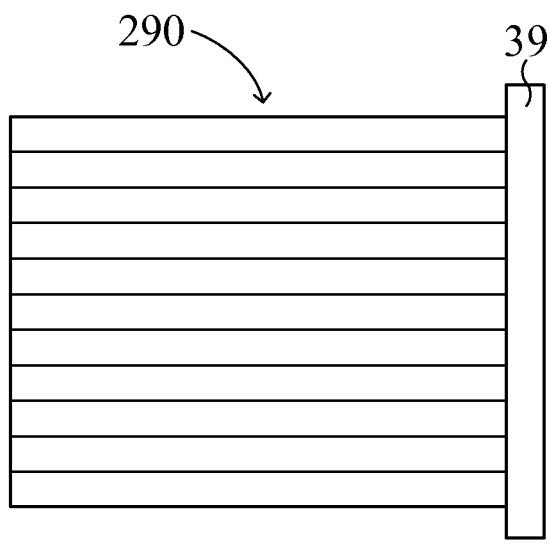
Figure 3D:
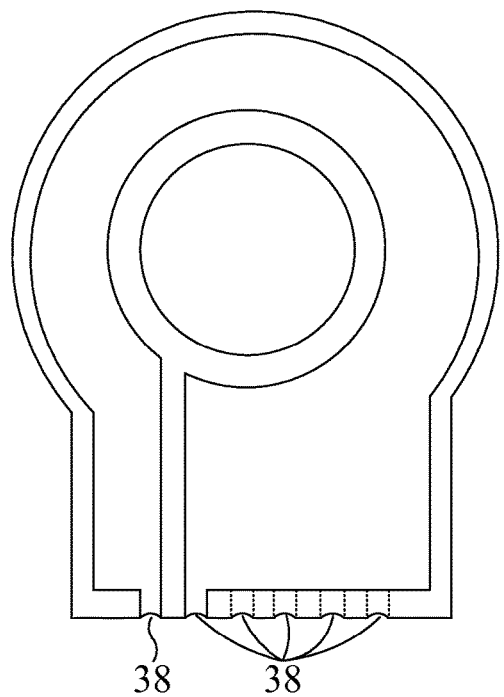
Figure 3E:
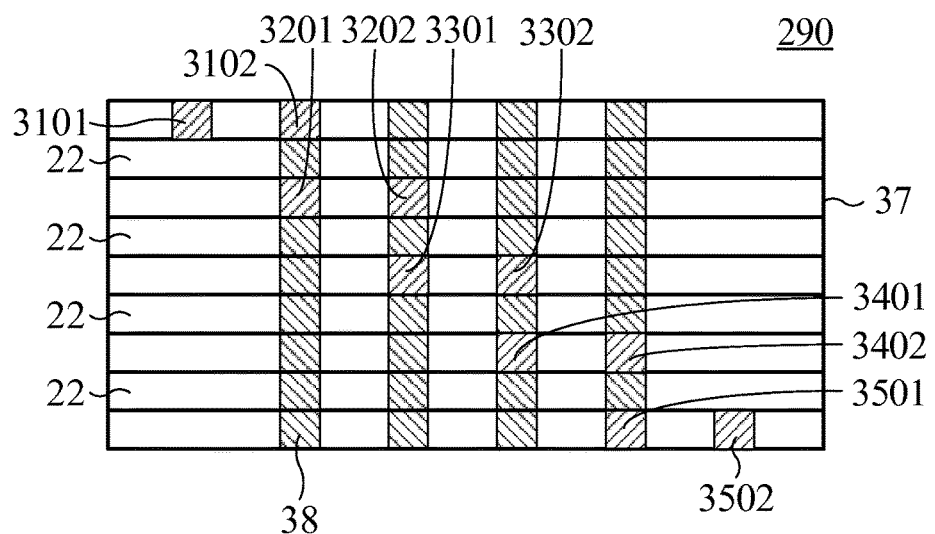

In another embodiment, a plating through hole (PTH) process instead of the connecting member is used. Plated through holes 38 are formed on the cutting surface 37 and cover corresponding exposed or revealed leads, as shown in FIG. 3D. The plated through hole process includes procedures of drilling, hole wall activation and through hole plating. In FIG. 3E, taking advantage of the plated through holes 38, the right lead 3102 of the wiring pattern 310 is electrically connected to the left lead 3201 of the wiring pattern 320; the right lead 3202 of the wiring pattern 320 is electrically connected to the left lead 3301 of the wiring pattern 330; the right lead 3302 of the wiring pattern 330 is electrically connected to the left lead 3401 of the wiring pattern 340; and the right lead 3402 of the wiring pattern 340 is electrically connected to the left lead 3501 of the wiring pattern 350. Other surface treatments may be further applied to the multi-layer wiring unit 290 before the cutting procedure to improve the performance. For example, solder mask or solder resist is applied to the top and bottom surfaces to protect the wiring patterns (copper wires) against oxidation. Other surface platings used are organic solderability preservative (OSP), immersion silver (IAg), immersion tin, electroless nickel with immersion gold (ENIG), electroless nickel electroless palladium immersion gold (ENEPIG) and direct gold plating (over nickel).

If even top/bottom surface is an important issue, the uppermost/lowermost layer of the multi-layer wiring structure is not the conductive structure including the wiring patterns. Otherwise, the uppermost/lowermost wiring is formed by the traditional pattern method. For example, the laminated structure includes conductive structures and insulating layers arranged in an alternate manner wherein the conductive structures are formed by the stamping (pressing) process or the etching process before the lamination step. The uppermost layer and the lowermost layer of the laminated structure are two pieces of even copper foil. To form the uppermost/lowermost wiring, the even copper foil is patterned through procedures of photoresist application, exposure, developing, etching and photoresist removal. Then, surface treatments may be further applied to the multi-layer wiring structure to improve the performance before or after routing or contour cutting. For example, solder mask or solder resist, organic solderability preservative (OSP), immersion silver (IAg), immersion tin, electroless nickel with immersion gold (ENIG), electroless nickel electroless palladium immersion gold (ENEPIG) or direct gold plating (over nickel) is applied to the top and bottom surfaces. The conductive structures in the multi-layer wiring structure and the uppermost/lowermost wiring are electrically connected in a desired and proper manner to provide various electronic units, e.g. compact coil.

The multi-layer wiring structure according to the present disclosure can be applied to high power applications. Although thicker copper wires are used in the high power PCB type multi-layer wiring structure, the undercutting problem is overcome. Therefore, it is not necessary to enlarge the spacing of wires to maintain required insulating properties. Thus, electronic units with compact size are also applicable to higher power applications.

It is to be noted that the present invention does not limit the shape of the wiring patterns or the conductive structures. If there are electronic elements to be soldered onto the PCB type multi-layer wiring structure, shape design of the wiring patterns or the conductive structures should meet required soldering conditions, e.g. soldering joint position.

Planar magnetic elements such as planar transformers or planar inductors can use the PCB type compact coils as described above. The compact coil may serve as at least one winding (primary winding/secondary winding) of the planar transformer or the planar inductor. For the planar transformer, at least two windings are required and the compact coil according to the present disclosure can be applied to at least one of the windings of the planar transformer. The windings are wound around a magnetic core to form the planar transformer. For the planar inductor, at east one winding is required and it is implemented by the PCB type compact coil according to the present disclosure. If the planar inductor is a common mode inductor or a coupled inductor, two windings having the same spiral turns (i.e., the layers of the pattern wirings in the compact coils) are required.

Figure 4:
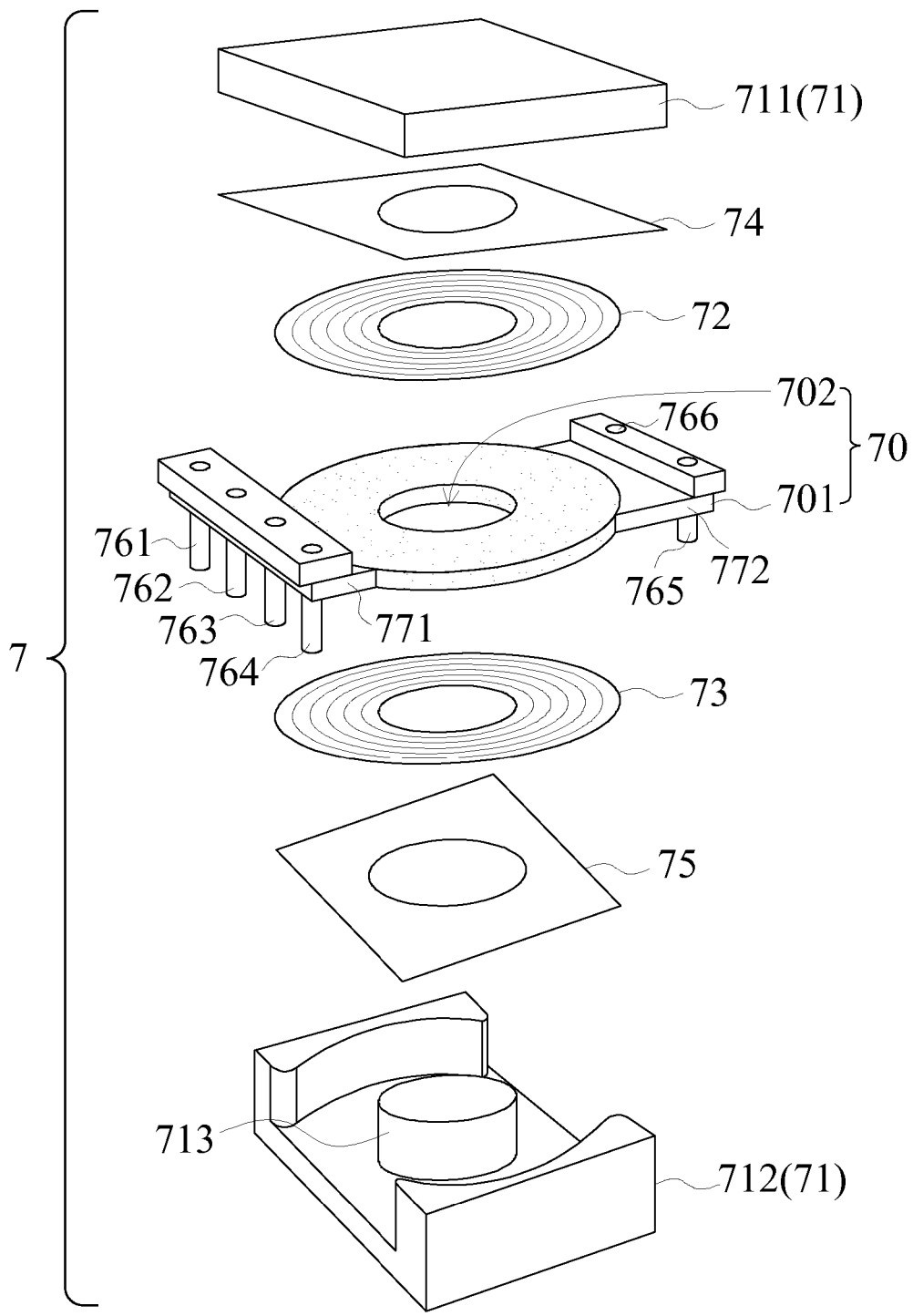
FIG. 4 is an exploded view illustrating a magnetic element having the multi-layer wiring structure according to an embodiment of the present invention.

Please refer to FIG. 4, an exploded view illustrating a magnetic element having the multi-layer wiring structure according to an embodiment of the present invention. The planar magnetic element 7 includes a winding unit 70 and a magnetic core 71. The winding unit 70 may use the PCB type multi-layer wiring unit of FIG. 3C or FIG. 3E, and is electrically equivalent to at least one winding. The number of the windings in the multi-layer wiring unit is determined according to the electrical connection relation of the wiring patterns. The winding unit 70 includes a main body 701, and a center through hole 702 is formed on the main body 701. The magnetic core 71 is a two-piece magnetic core including a first core piece 711 and a second core piece 712. For example, the two-piece magnetic core 71 may be an E-I type magnetic core or an E-E type magnetic core. The second core piece (E-shape core) 712 has a center shaft 713. The winding unit 70 is disposed between the first core piece 711 and the second core piece 712, and the center shaft 713 of the second core piece 712 passes through the center through hole 702 of the winding unit 70 and is connected to the first core piece 711 so that the main body 701 of the winding unit 70 is wound around the center shaft 713 of the second core piece 712. For example, the center shaft 713 is bound to the first core piece 711 via epoxy resin.

The magnetic element 7 further includes a first winding 72 and a second winding 73 having a form of a wire cake. Each of the first winding 72 and the second winding 73 functions as a primary winding, a secondary winding or an auxiliary winding. In this embodiment, the winding unit 70, the first winding 72 and the second winding 73 are a secondary winding, a primary winding and an auxiliary winding, respectively. The first winding 72 is disposed between the main body 701 of the winding unit 70 and the first core piece 711. The second winding 73 is disposed between the main body 701 of the winding unit 70 and the second core piece 712. It is to be noted that the present disclosure does not limit the relative positions of the windings of the magnetic element 7. In other embodiments, the first winding 72 and/or the second winding 73 may be implemented by the multi-layer wiring units of FIG. 3C or FIG. 3E rather than the wire cakes.

In addition, a first insulating film 74 is sandwiched between the first core piece 711 and the first winding 72, while a second insulating film 75 is sandwiched between the second winding 73 and the second core piece 712. The first winding 72, the second winding 73, the first insulating film 74 and the second insulating film 75 have center through holes corresponding to the center through hole 702 of the winding unit 70 for passing of the center shaft 713 of the second core piece 712.

Furthermore, the magnetic element 7 includes six pins 761~766 and two bobbins 771~772. The pins 761~766 are mounted on notches (not shown) at two opposite sides of the winding unit 70 and fixed to the bobbins 771~772. The bobbins 771~772 can enhance the firmness of the pins 761~766. For example, the positions of the two notches at the right side correspond to the leads 3101 and 3502 (FIG. 3E), respectively. Therefore, the pins 765 and 766 are electrically connected to the leads 3101 and 3502 via the plated through holes 38. The other four pins 761~764 at the left side are electrically connected to two terminals (not shown) of the first winding 72 and the second windings 73, respectively. Then, the six pins 761~766 are electrically connected to a system board (not shown). Through electrically connecting the pins 761~766 on the system board in a proper and desired manner, the winding unit 70, the first winding 72 and the second winding 73 are electrically connected to provide various kinds of magnetic elements 70. In another embodiment, at least one of the bobbins 771~772 are eliminated, and the pins are directly fixed in the corresponding notches or plated through holes 38 of the winding unit 70.

Figure 5A:
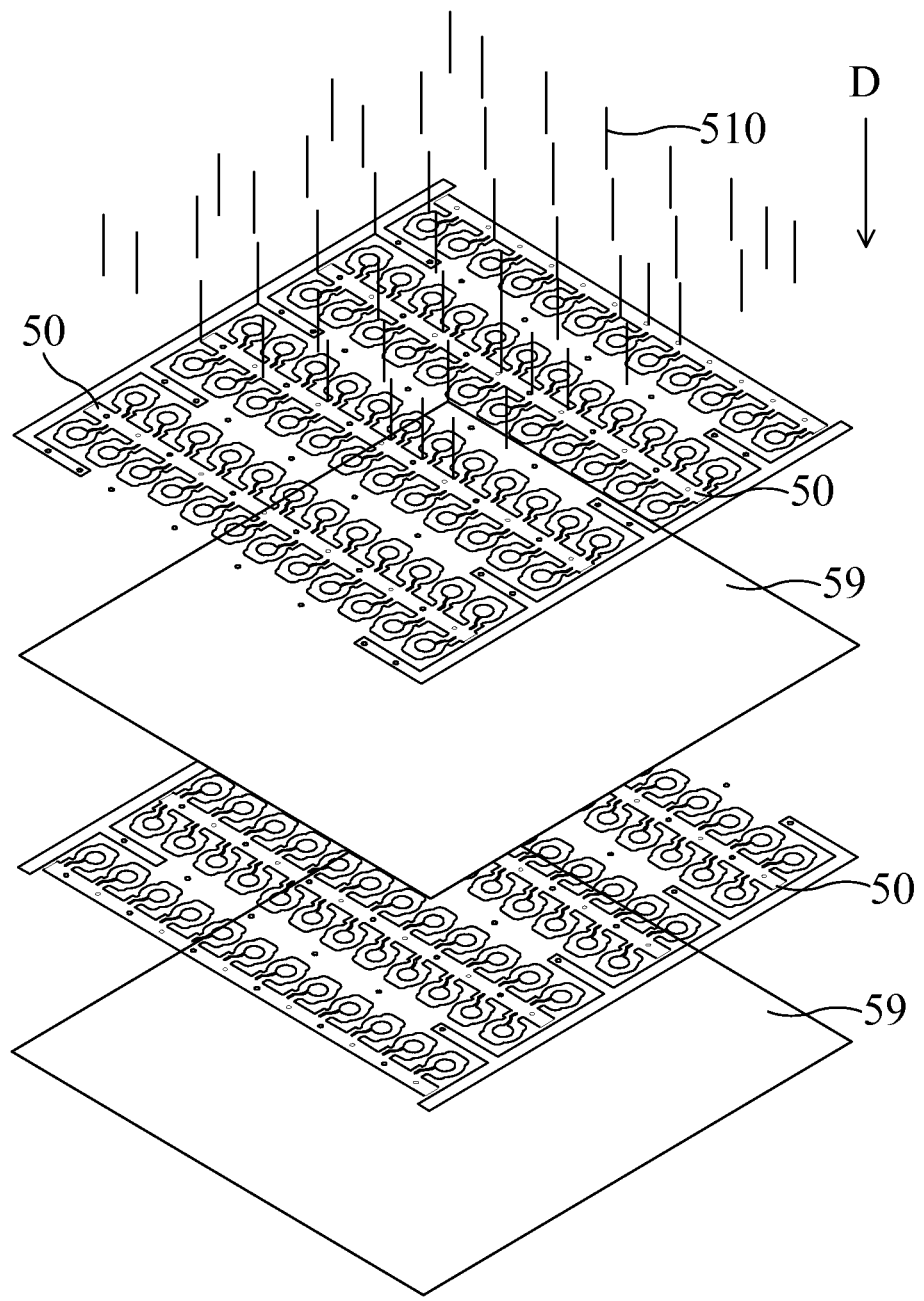
FIGS. 5A&5B are schematic diagrams illustrating the manufacturing method used for mass production.
Figure 5B:
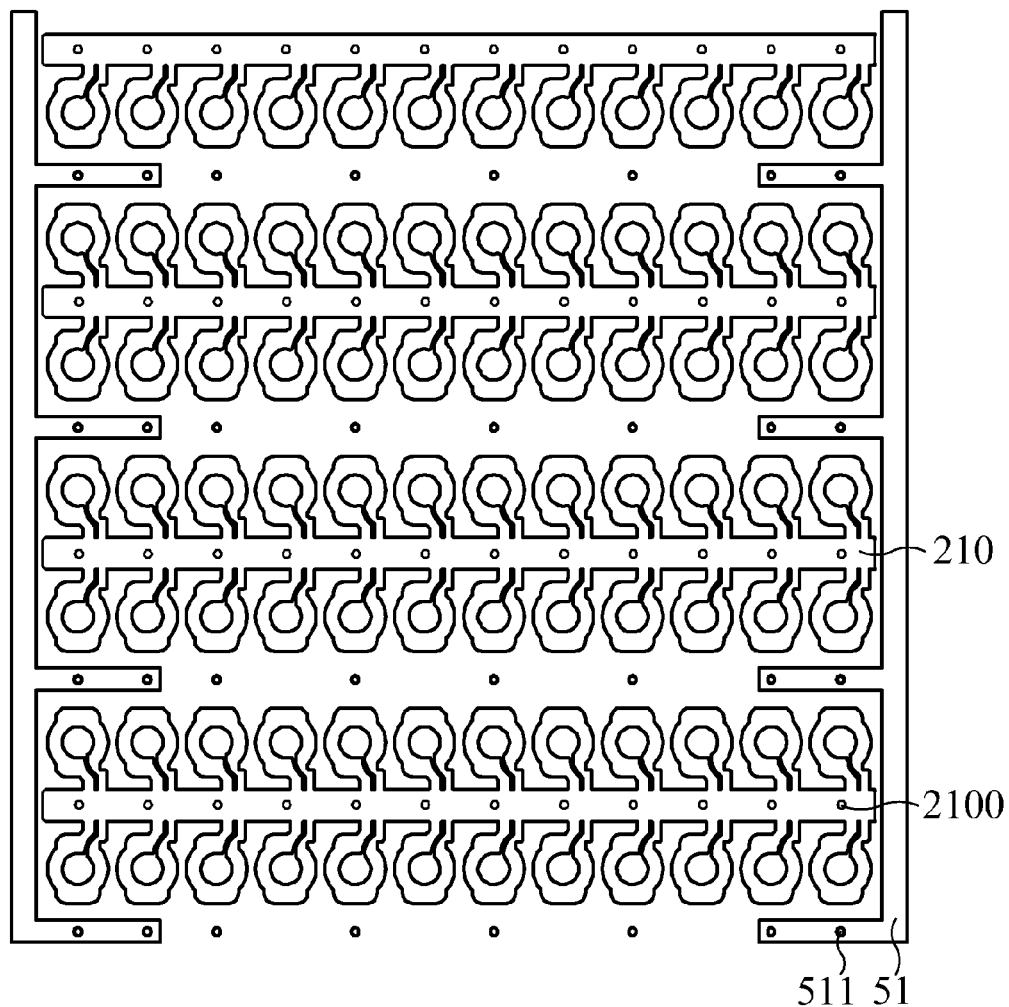

Please refer to FIG. 5A and FIG. 5B, schematic diagrams illustrating the manufacturing method for mass production of the multi-layer wiring unit. The conductive structures 50 including a lot of wiring patterns are formed (on soft sheets or not) by the stamping (pressing) process or the etching process. The conductive structures 50 may further include a confining structure 51 at an edge of the conductive structures 50 or a space between two wiring patterns/conductive structures 50 to limit the shift range of the wiring patterns. The present disclosure does not limit the shape of the confining structure 51. The conductive structures 50 and the insulating layers 59 are stacked in an alternate manner. Then, the positioning pins 510 are inserted into the positioning holes 511 of the confining structure 51 and the positioning holes 2100 of the connection strips 210 of different conductive structures 50 along the laminating direction D to vertically align the conductive structures 50. Since the insulating layers 59 are made of thin prepreg, it is easy for the positioning pins 510 to penetrate the insulating layers 59. The stacked structure are laminated and cut into multi-layer wiring units. Because of the positioning pins 510, only slight horizontal shift or even no shift of the conductive structures 50 occurs during the lamination step. Thus, the alignment of the conductive structures 50 is highly improved. Therefore, the relative positions of the leads (FIG. 3B) can be well controlled to avoid malfunction.

Figure 6:
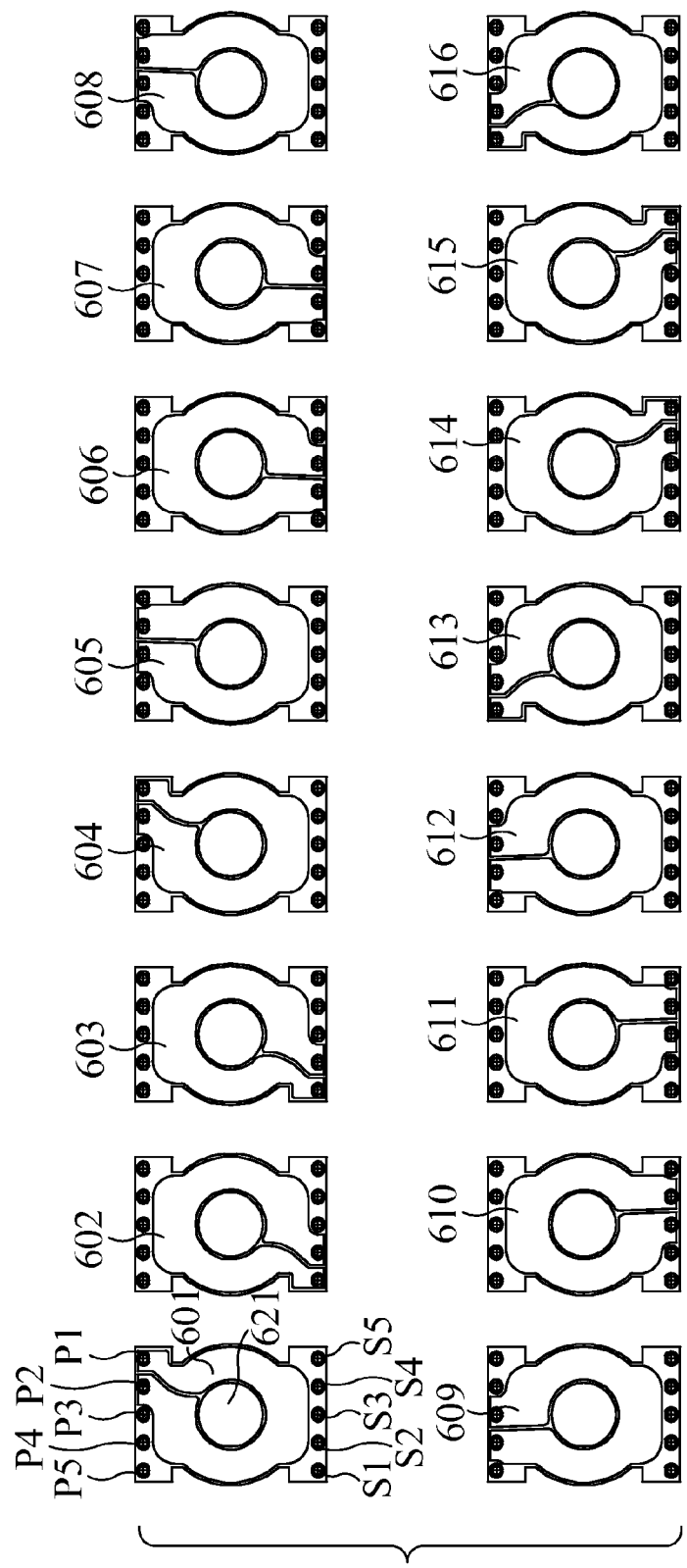
FIG. 6 is a schematic diagram illustrating wiring patterns for windings of a transformer according to the present disclosure.

Please refer to FIG. 6, a schematic diagram illustrating wiring patterns for windings of a transformer according to the present disclosure. The wiring patterns 601~616 and the insulating layers (not shown) are stacked from top to bottom in an alternate manner. The wiring patterns 601, 604, 605, 608, 609, 612, 613 and 616 are electrically connected through the pins (or plated through holes) P1~P5 to form a first winding. The wiring patterns 602, 603, 606, 607, 610, 611, 614 and 615 are electrically connected through the pins (or plated through holes) S1~S5 to form a second winding. A magnetic core passes the center through holes 621 of the wiring patterns 601~616. Thus, each of the first winding and the second winding may function as one of the primary winding, the secondary winding and the auxiliary winding of the transformer.

Figure 7A:
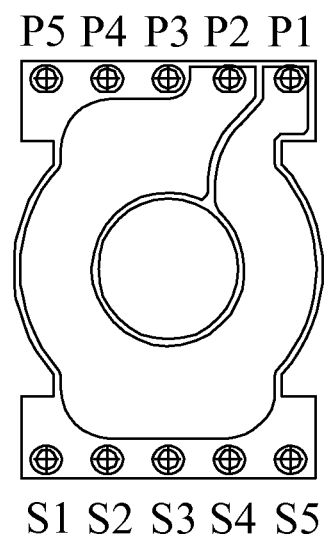
FIGS. 7A~7C are a top view and circuit diagrams of the transformer formed by assembling the wiring patterns of FIG. 6.
Figure 7B:
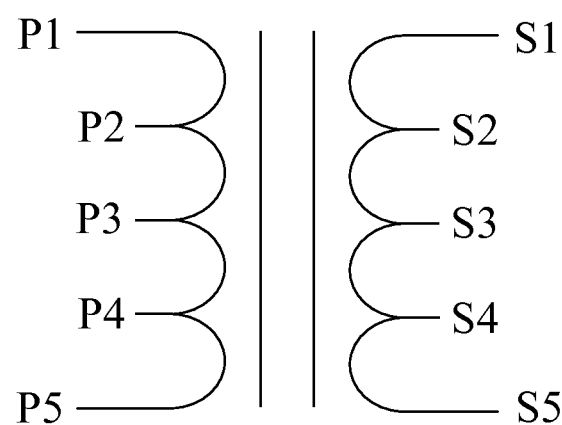
Figure 7C:
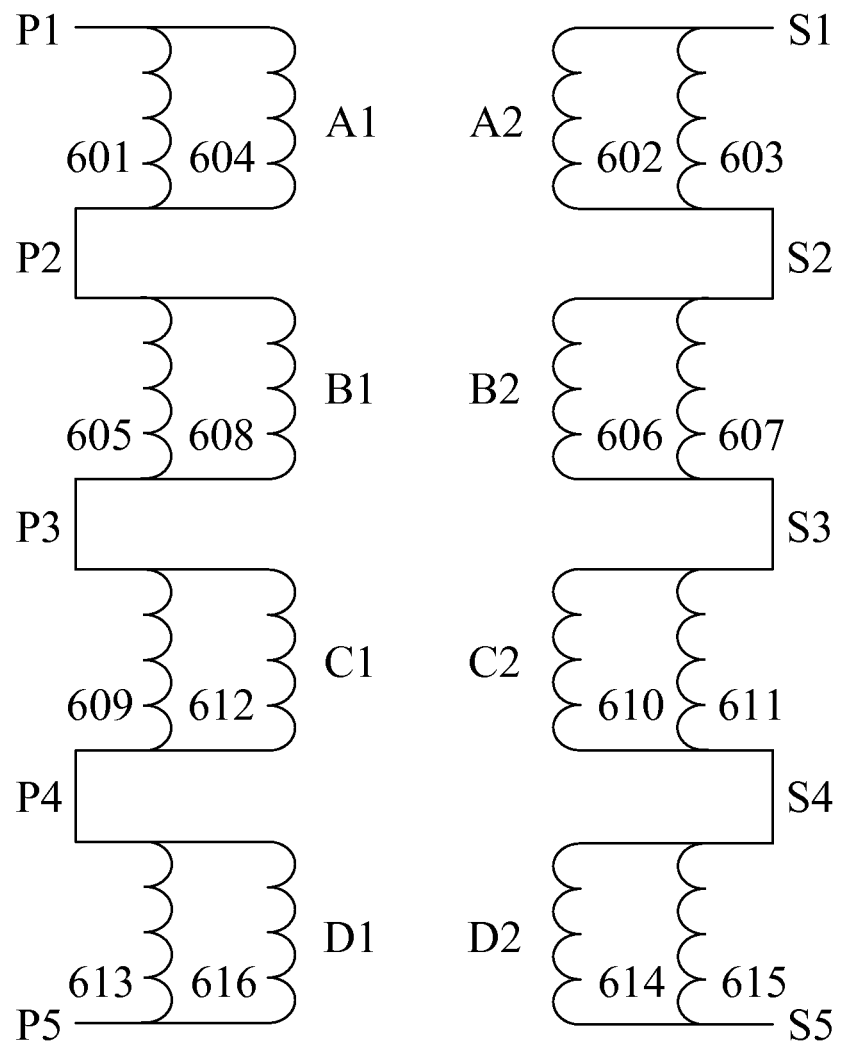

FIG. 7A shows assembly of the wiring patterns of FIG. 6. The pins P1~P5 and S1~S5 represent nodes of the transformer of FIG. 7B. FIG. 7C shows a circuit diagram of the transformer. Referring to FIG. 7C, it is known that the wiring patterns 601 and 604 are connected in parallel between the nodes P1 and P2. The wiring patterns 601 and 605 are connected in series through the node P2. The other electrical connection relation of the wiring patterns 601~616 can be derived from FIG. 7C based on the same principles and is not described verbosely. In each of the groups A1, A2, B1, B2, C1, C2, D1 and D2, the two wiring patterns have the same shape. After rotating or flipping the wiring patterns, it is found that the wiring patterns 601~604 and 613~616 in the groups A1, A2, D1 and D2 have the same shape, while the wiring patterns 605~612 in the groups B1, B2, C1 and C2 have the same shape. Therefore, only two molds are required to form the conductive structures including the wiring patterns 601~616. Therefore, compared with the conventional step for forming the wires, the step of forming the conductive structures in the manufacturing method of the present disclosure is significantly simplified. Shorter production period and lower production cost are achieved.

Figure 8:
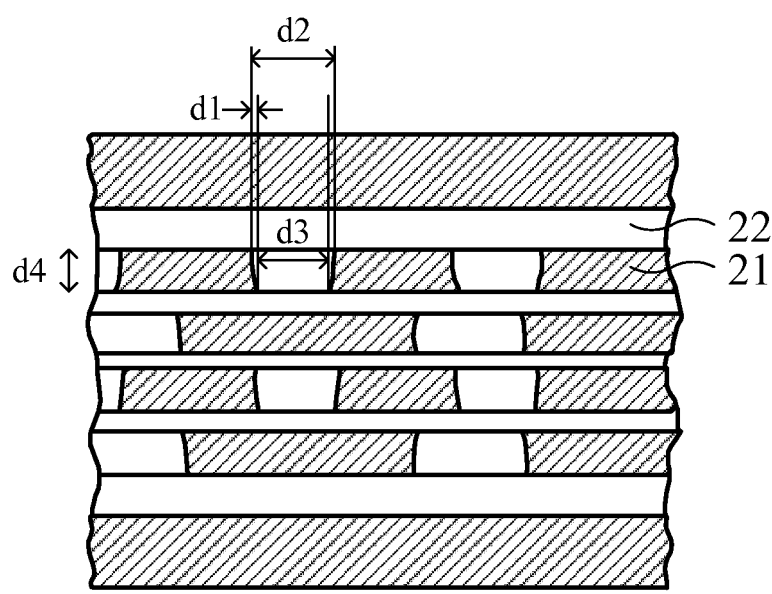
FIG. 8 is a cross-sectional view illustrating the multi-layer wiring structure formed by the manufacturing method according to the present disclosure.

Please refer to FIG. 8, a cross-sectional view illustrating the multi-layer wiring structure formed by the manufacturing method according to the present disclosure. The thickness d4 of the conductive structure 21 is about 0.1 mm~0.3 mm for high power application. Under these conditions, the bias d1 of the conductive structure 21 (or wiring pattern) can be reduced to less than 5 μm. The thickness of the insulating layer 22 may range from 0.015 mm to 0.2 mm, about one tenth of the thickness of the substrate of the conventional copper clad laminate. In an embodiment, the conductive structure 21 has a thickness of 0.25 mm and the insulating layer 22 has a thickness of 0.09 mm. In another embodiment, the conductive structure 21 has a thickness of 0.20 mm and the insulating layer 22 has a thickness of 0.15 mm. According to the manufacturing method, pollution problem is overcome and advantages such as short production period and low production are gained. The present disclosure is especially applicable for high power application with compact size, e.g. multi-layer wiring structure and compact coil used with power lines, planar transformer and planar inductor including choke, common mode choke, current limiting reactor, etc. Furthermore, fault diagnosis of the PCB type multi-layer wiring structure such as thickness of insulating layers and alignment shift of wiring patterns can be easily made through the cutting surface of the multi-layer wiring structure without destructive testing.

It is to be noted that the direction-relative terms, e.g. "right", "left", "top", "bottom" in the specification are given for illustration only, and they are not used to limit the real positions of elements of the present disclosure. Similar modifications are still included within the scope of the present disclosure.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a multi-layer wiring structure, comprising steps of:

providing a first conductive structure and a second conductive structure, each of the first conductive structure and the second conductive structure comprising a plurality of wiring patterns and being a single conductive layer made of a metal material or an alloy material, the first conductive structure or the second conductive structure comprising a confining structure at an edge of the first conductive structure or the second conductive structure or a space between two of the wiring patterns, the first conductive structure comprising a first connection strip and the second conductive structure comprising a second connection strip, the wiring patterns of the first conductive structure having the same shape and being connected to the first connection strip, the wiring patterns of the second conductive structure having the same shape and being connected to the second connection strip;

disposing an insulating layer between the first conductive structure and the second conductive structure;

inserting a first positioning pin in a first positioning hole formed on the confining structure along a laminating direction; and laminating the first conductive structure, the insulating layer and the second conductive structure to form the multi-layer wiring structure, wherein an entire insulating thickness between the first conductive structure and the second conductive structure is thinner than the single conductive layer of the first conductive structure or the second conductive structure after the laminating step.

2. The manufacturing method according to claim 1, wherein the wiring patterns of the first conductive structure and the second conductive structure are formed by a stamping procedure or an etching procedure.

3. The manufacturing method according to claim 1, wherein the insulating layer is made of prepreg, and the first conductive structure and the second conductive structure are made of copper or an alloy material wherein surfaces of the first conductive structure and the second conductive structure are roughened by brown oxide treatment.

4. The manufacturing method according to claim 1, wherein the entire insulating thickness after the laminating step ranges from 0.015 mm to 0.2 mm, and a thicknesses of the first conductive structure and the second conductive structure after the laminating step range from 0.1 mm to 0.3 mm.

5. The manufacturing method according to claim 1, wherein the first conductive structure, the insulating layer and the second conductive structure are laminated by hot press lamination.

6. The manufacturing method according to claim 5, wherein the laminating step further comprises a step of preheating the first conductive structure and the second conductive structure.

7. The manufacturing method according to claim 1, wherein a second positioning pin is inserted in a second positioning hole formed on the first connection strip and a third positioning hole formed on the second connection strip along a laminating direction during the laminating step.

8. The manufacturing method according to claim 1, further comprising a step of cutting the multi-layer wiring structure to remove the first connection strip and the second connection strip and form a plurality of multi-layer wiring units, a plurality of leads of the wiring patterns being revealed on a cutting surface of each of the multi-layer wiring units.

9. The manufacturing method according to claim 8, further comprising a step of coupling a connecting member to a corresponding one of the multi-layer wiring units to electrically connect the revealed leads of the corresponding multi-layer wiring unit.

10. The manufacturing method according to claim 1, wherein the wiring patterns are ring shaped wiring patterns.

11. A manufacturing method of a multi-layer wiring structure, comprising steps of:

providing a first conductive structure and a second conductive structure, the first conductive structure comprising a first connection strip and a plurality of first wiring patterns connected to the first connection strip, the second conductive structure comprising a second connection strip and a plurality of second wiring patterns connected to the second connection strip, a first positioning hole being formed on the first connection strip and a second positioning hole being formed on the second connection strip;

disposing an insulating layer between the first conductive structure and the second conductive structure;

inserting a first positioning pin in the first positioning hole and the second positioning hole along a laminating direction, the first positioning pin further penetrating through the insulating layer; and laminating the first conductive structure, the insulating layer and the second conductive structure along the laminating direction to form the multi-layer wiring structure.

12. The manufacturing method according to claim 11, wherein an entire insulating thickness between the first conductive structure and the second conductive structure is thinner than the first conductive structure or the second conductive structure after the laminating step.

13. The manufacturing method according to claim 11, wherein the first wiring patterns of the first conductive structure having the same shape, and the second wiring patterns of the second conductive structure having the same shape.

14. The manufacturing method according to claim 11, wherein the first wiring patterns or the second wiring patterns are ring shaped wiring patterns.

15. The manufacturing method according to claim 11, wherein the first conductive structure or the second conductive structure comprises a confining structure at an edge of the first conductive structure or the second conductive structure or a space between two of the first wiring patterns or the second wiring patterns, a second positioning pin is inserted in a third positioning hole formed on the confining structure along the laminating direction during the laminating step.

16. The manufacturing method according to claim 11, further comprising a step of cutting the multi-layer wiring structure to remove the first connection strip and the second connection strip and form a plurality of multi-layer wiring units, a plurality of leads of the wiring patterns being revealed on a cutting surface of each of the multi-layer wiring units.

17. The manufacturing method according to claim 16, further comprising a step of coupling a connecting member to a corresponding one of the multi-layer wiring units to electrically connect the revealed leads of the corresponding multi-layer wiring unit.

* * * * *